(12) United States Patent
Buffet et al.

(10) Patent No.: US 6,538,314 B1
(45) Date of Patent: Mar. 25, 2003

(54) POWER GRID WIRING FOR SEMICONDUCTOR DEVICES HAVING VOLTAGE ISLANDS

(75) Inventors: Patrick H. Buffet, Essex Junction, VT (US); Yu H. Sun, Beaverton, OR (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,210

(22) Filed: Mar. 29, 2002

(51) Int. Cl.[7] .............................................. H01L 23/52
(52) U.S. Cl. ....................................... 257/691; 257/208
(58) Field of Search ................................. 257/691, 208, 257/737

(56) References Cited

U.S. PATENT DOCUMENTS 5,119,168 A * 6/1992 Misawa ...................... 257/691
6,445,065 B1 * 9/2002 Gheewala et al. .......... 257/691
2001/0054760 A1 * 12/2001 Ito et al. ..................... 257/691

* cited by examiner

Primary Examiner—David Nelms
Assistant Examiner—Tu-Tu Ho
(74) Attorney, Agent, or Firm—Schmeiser, Olsen & Watts; Richard A. Henkler

(57) ABSTRACT

A semiconductor device comprising: a global power bus having a first portion for supplying power to a first set of circuits and a second portion for supplying power to a second set of circuits; a local power bus for supplying alternative power to the second set of circuits; and wherein the total of the width of the second portion of the global power bus and of the width of the local power bus does not exceed the width of the first portion of the global power bus.

19 Claims, 11 Drawing Sheets

POWER GRID WIRING FOR SEMICONDUCTOR DEVICES HAVING VOLTAGE ISLANDS

BACKGROUND OF THE INVENTION

1. Field of the Invention

The present invention relates to the field of semiconductor devices; more specifically, it relates a power grid for supplying power to an integrated circuit chip having a voltage island.

2. Background of the Invention

In an effort to increase performance, lower power consumption and integrate several integrated circuit technologies on the same chip, the concept of voltage islands has been introduced into integrated circuit design.

The voltage island concept allows for one or more portions of an integrated circuit chip to be powered by both a global (chip wide) power source (VDDG) and a local or voltage island power source (VDDI). VDDG and VDDI can be switched on and off by the user as the operation of the integrated circuit demands.

Because voltage islands require both global and local power sources space must be allocated in the voltage island to accommodate wiring grids for both power sources. Wiring grids are placed in the upper wiring levels, usually in the last wiring level of integrated circuit chips. Often, especially for peripheral pad chips, for example wirebond chips, there is either not enough room for both sets of grids or for both sets of grids and additional wiring, for example, I/O signals.

The conventional solution to this problem is to increase the area of the voltage island, and consequently, increase the size of the chip, to provide sufficient wiring space. This leads to waste of silicon space and increased costs as well as reduced performance because of longer wire lengths.

An alternative that does not require increasing the size of the chip to include voltage island power grids and I/O signal wiring is required to avoid unnecessary costs and degraded device performance.

BRIEF SUMMARY OF THE INVENTION

A first aspect of the present invention is a semiconductor device comprising: a global power bus having a first portion for supplying power to a first set of circuits and a second portion for supplying power to a second set of circuits; a local power bus for supplying alternative power to the second set of circuits; and wherein the total of the width of the second portion of the global power bus and of the width of the local power bus does not exceed the width of the first portion of the global power bus.

A second aspect of the present invention is an integrated circuit chip comprising: a first set of circuits contained within a device region of the integrated circuit chip; a second set of circuits contained within a voltage island, the voltage island contained within the device region; a global power bus having a first portion outside of the voltage island for supplying power to the first set of circuits and a second portion within the voltage island for supplying power to the second set of circuits; a local power bus within the voltage island for supplying alternative power to the second set of circuits; and wherein the total of the width of the second portion of the global power bus and of the width of the local power bus does not exceed the width of the first portion of the global power bus.

A third aspect of the present invention is a method of supplying power to an integrated circuit chip comprising: providing a global power bus having a first portion for supplying power to a first set of circuits and a second portion for supplying power to a second set of circuits; providing a local power bus for supplying alternative power to the second set of circuits; and wherein the total of the width of the second portion of the global power bus and of the width of the local power bus does not exceed the width of the first portion of the global power bus.

BRIEF DESCRIPTION OF THE SEVERAL VIEWS OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purposes of the present invention, the term semiconductor device is intended to include integrated circuits and integrated circuit chips.

The invention will be described in terms of a general global power bus and a general voltage island power bus. The general global bus includes a wide portion (with a width "$W_G$") outside a voltage island and supplies power to circuits outside of the voltage island and includes a narrow portion (with a width "$W_{GI}$") inside the voltage island for supplying power to circuits inside of the voltage island. The general voltage island power bus supplies alternative power to the circuits inside of the voltage island and has a width "$W_I$". A voltage island power bus is a local power bus supplying alternative power only to the voltage island. The present invention is applicable to global power ($V_{DDG}$)

buses, global ground (GND$_G$) buses and voltage island power buses (V$_{DDI}$) and voltage island ground (GND$_I$) buses as well.

Figure 1:
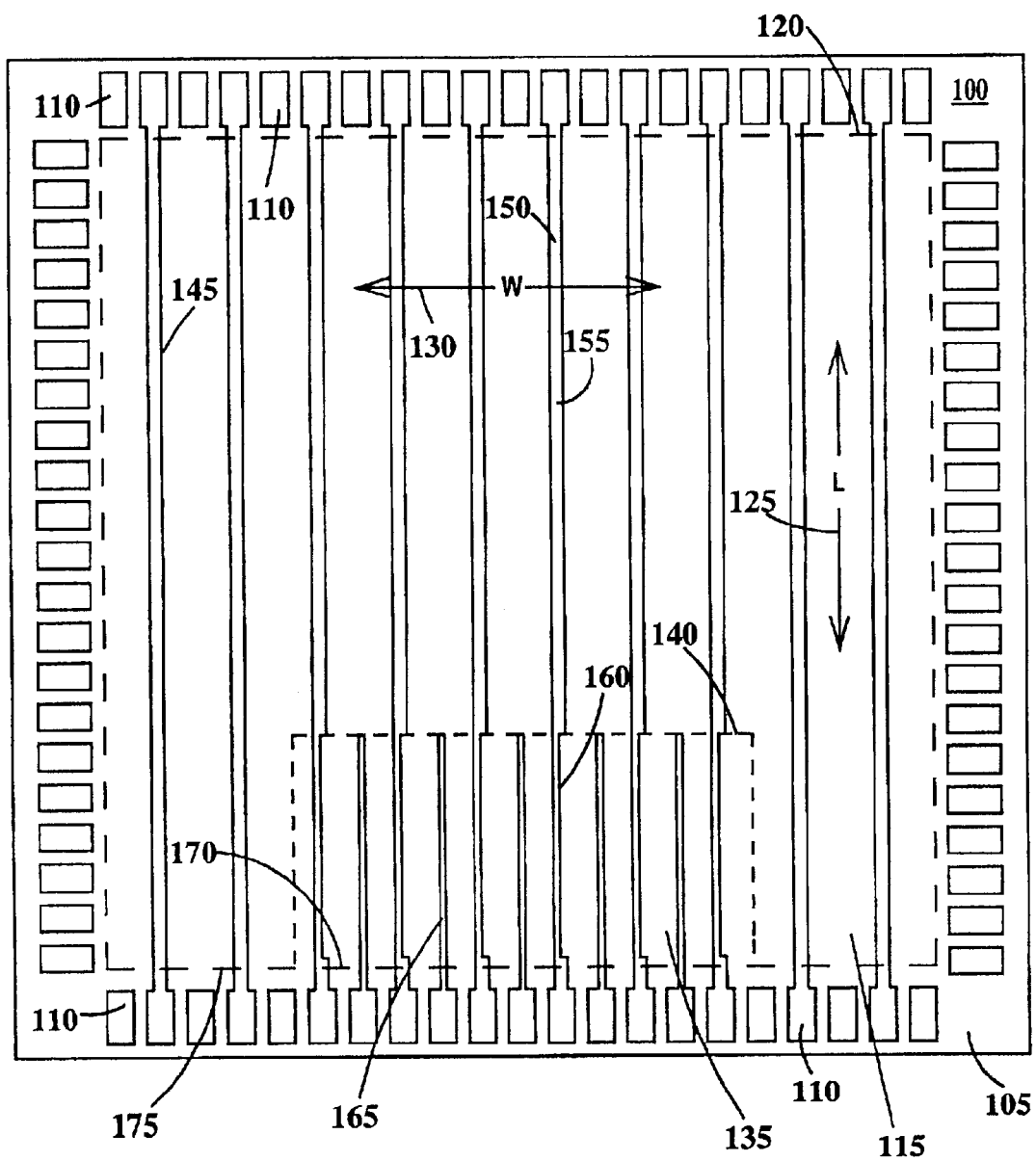
FIG. 1 is a plan view of the power bus of an integrated circuit having a voltage island according to a first embodiment of the present invention.

FIG. 1 is a plan view of the power grid of an integrated circuit having a voltage island according to a first embodiment of the present invention. In FIG. 1, an integrated circuit chip 100 includes an outer peripheral region 105 having a multiplicity of peripheral pads 110 and an inner device region 115 having a perimeter 120. In one example, pads 110 are wire-bond pads. In another example, pads 110 are tape automated bond (TAB) bumps. In still another example, pads 110 are solder bump pads for receiving solder balls. Integrated chip 100 extends in a length (L) direction 125 and a width (W) direction 130. Contained within device region 115 is a voltage island 135 having a perimeter 140.

A first set of global power buses 145 extend across chip 100 along length direction 125 between a first and a second subset of pads 110 which are located on opposite sides of the chip. A second set of global power buses 150 extends across chip 100 along length direction 125 and through voltage island 135 between a third and fourth subset of pads 110 which are located on opposite sides of the chip. Global power buses 150 have a wide portion 155 outside of voltage island 135 and a narrow portion 160 inside of the voltage island.

Voltage island 135 further includes voltage island power buses 165 extending from a fifth subset of pads 110. Voltage island power buses 165 and narrow portions 160 of global power buses 150 extend parallel to each other.

In the first embodiment of the present invention, a side 170 of voltage island 135 is co-incident with a portion of side 175 of device region 115. Sides 170 and 175 both extend along width direction 130.

Figure 2:
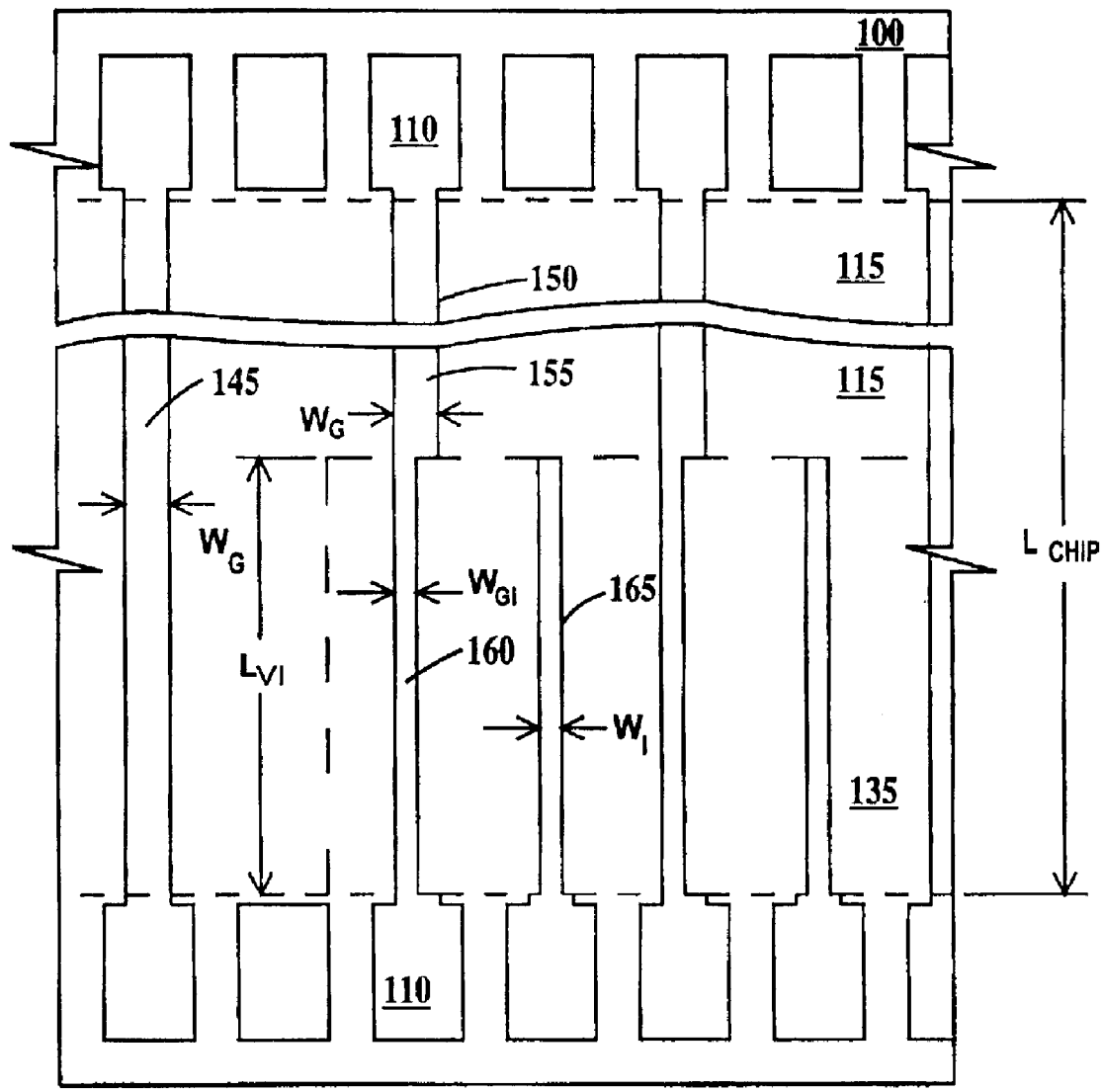
FIG. 2 is a plan view of a portion of the integrated circuit of FIG. 1 illustrating the widths of the various power buses.

FIG. 2 is a plan view of a portion of the integrated circuit of FIG. 1 illustrating the widths of the various power buses. In FIG. 2, each global power bus 145 has a width "$W_G$," each wide portion 155 of global power buses 150 has a width "$W_G$," each narrow portion 160 of global power buses 150 has a width "$W_{GI}$" and each voltage island power bus 165 has a width "$W_I$." "$W_I$"+"$W_{GI}$" is less than or equal to "$W_G$." "$W_{GI}$" and "$W_I$" may or may not be equal. Device region 115 of integrated circuit chip 100 has a length "$L_{CHIP}$" (effectively the length of the global power buses 145 and 150). Voltage island 135 has a length "$L_{VI}$."

When designing power buses, electro-migration and IR drop are two major considerations. For a chip having peripheral pads the IR drop is the more important of the two and IR drop dictates the power bus widths. A relationship between global and voltage island power bus widths and the lengths of the chip and the voltage island in the direction of the buses can be developed as described below.

The case having the maximum voltage ("IR") drop of global power bus 145 (see FIG. 2) is:

$$V_{IR1} = \frac{I \rho L_{CHIP}}{8 W_G} \quad (1)$$

where: I=the current in the global power bus; $\ddot{I}\square$=the sheet resistance of the bus; $L_{CHIP}$=the length of the chip in the bus direction (effectively the length of the bus); and $W_G$=the width of the bus. The worse case drop of global power bus 150 (see FIG. 2) is:

$$V_{IR2} = \frac{I \left(\frac{L_{CHIP}}{2} - L_{VI}\right)}{L_{CHIP}} \left[ \frac{\rho \left(\frac{L_{CHIP}}{2} - L_{VI}\right)}{2 W_G} + \frac{\rho L_{VI}}{W_{GI}} \right] \quad (2)$$

where: I=the current in the global power bus; $\ddot{I}\square$=the sheet resistance of the bus; $L_{CHIP}$=the length of the device region in the bus direction; $L_{VI}$=the length of the voltage island in the bus direction; $W_G$=the width of the bus outside the voltage island; and $W_{GI}$=the width of the bus inside the voltage island.

Assuming the IR drop of the global bus 145 is the same as for global bus 150 (see FIG. 2) equation (1) can be set equal to equation (2) to derive the relationship between $W_G$ and $W_{GI}$:

$$\frac{W_{GI}}{W_G} = \frac{L_{CHIP} - 2L_{VI}}{L_{CHIP} - L_{VI}} \quad (3)$$

Assuming the current density of the voltage island is the same as the current density of the rest of the chip then the IR drop of voltage island power bus 165 (see FIG. 2) is:

$$V_{IR3} = \left(\frac{I L_{VI}}{L_{CHIP}}\right)\left(\frac{\rho L_{VI}}{2 W_I}\right) \quad (4)$$

where: I=the current in the voltage island power bus; and $W_I$=the width of the voltage island bus.

Setting equation (1) equal to equation (4):

$$\frac{W_I}{W_G} = \frac{4 L_{VI}^2}{L_{CHIP}^2} \quad (5)$$

Combining equation (3) with (5):

$$\frac{W_{GI} + W_I}{W_G} = \frac{L_{CHIP} - 2L_{VI}}{L_{CHIP} - L_{VI}} + \frac{4 L_{VI}^2}{L_{CHIP}^2} \quad (6)$$

Equation (6) is as a function of $L_{CHIP}/L_{VI}$ is plotted in FIG. 3 and described below.

Figure 3:
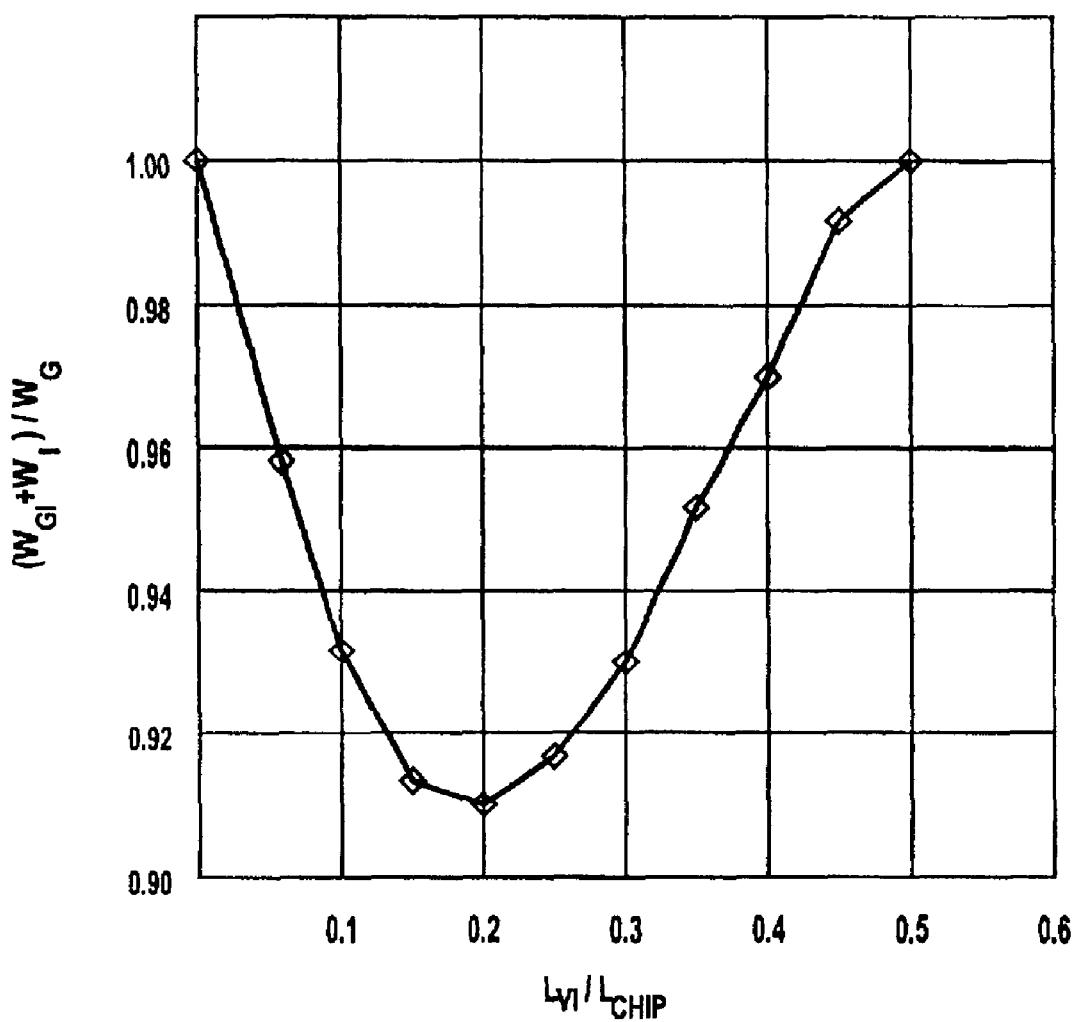
FIG. 3 is a plot of the relationship between the various power bus wiring widths and the lengths of the chip and voltage islands in the direction of the power buses for the first embodiment of the present invention.

FIG. 3 is a plot of the relationship between the various power grid wiring widths and the lengths of the chip and voltage islands in the direction of the power buses for the first embodiment of the present invention. Equation (6) is plotted. FIG. 3 shows that "$W_{GI}+W_I$" is always less than "$W_G$" and that at a ratio of "$L_{VI}/L_{CHIP}$" of about 0.2 "$(W_{GI}+W_I)/W_G$" is a minimum. The maximum saving in total power bus linewidth in the voltage island at the minimum of equation (6) is about 9% (approx. 0.91 in FIG. 3 on the $(W_{GI}+W_I)/W_G$ scale) compared to using an unreduced in width global power bus (1.0 in FIG. 3 on the $(W_{GI}+W_I)/W_G$ scale)in the voltage island. To obtain the maximum savings in total power bus width over simply using "$W_G$" for all buses inside and outside of the voltage island, "$W_G$", "$W_I$", "$W_{GI}$", "$L_{CHIP}$" and "$L_{VI}$" must all be selected to result in a minima in the $(W_{GI}+W_I)/W_G$ vs. $L_{VI}/L_{CHIP}$ plot of equation (6) as plotted in FIG. 3.

In developing equations (1) through (6) two simplifications are made. The first simplification is that the IR drop allowed in the voltage island is the same as the IR drop allowed in the non-voltage island portions of the device region. Equation (3) can be modified to account for the general case where the IR drops allowed are not the same by the expression:

$$\frac{W_{GI}}{W_G} = \frac{K_1(L_{CHIP} - 2L_{VI})}{L_{CHIP} - L_{VI}} \qquad (7)$$

where $K1=V_{IR1}/V_{IR2}$ {Equation (1)/equation (2)}.

The second simplification is that the current density in the voltage island is the same as the current density in the non-voltage island portions of the device region. Equation (2) can be modified to account for the general case where the current densities are not the same by the expression:

$$V_{IR2} = \frac{I_{CHIP}\left(\frac{L_{CHIP}}{2} - L_{VI}\right)}{L_{CHIP}} \left[\rho\frac{\left(\frac{L_{CHIP}}{2} - L_{VI}\right)}{2W_G} + \frac{K_2 \rho L_{VI}}{W_{GI}}\right] \qquad (8)$$

where $K_2=(I_{VI}/A_{VI})/(I_{CHIP}/A_{CHIP})$; $I_{VI}$=the total current flow in the voltage island; $I_{CHIP}$=the total current flow in the chip excluding the voltage island; $A_{VI}$=the total area of the voltage island; and $A_{CHIP}$=the total area of the chip excluding the area of the voltage island.

Figure 4:
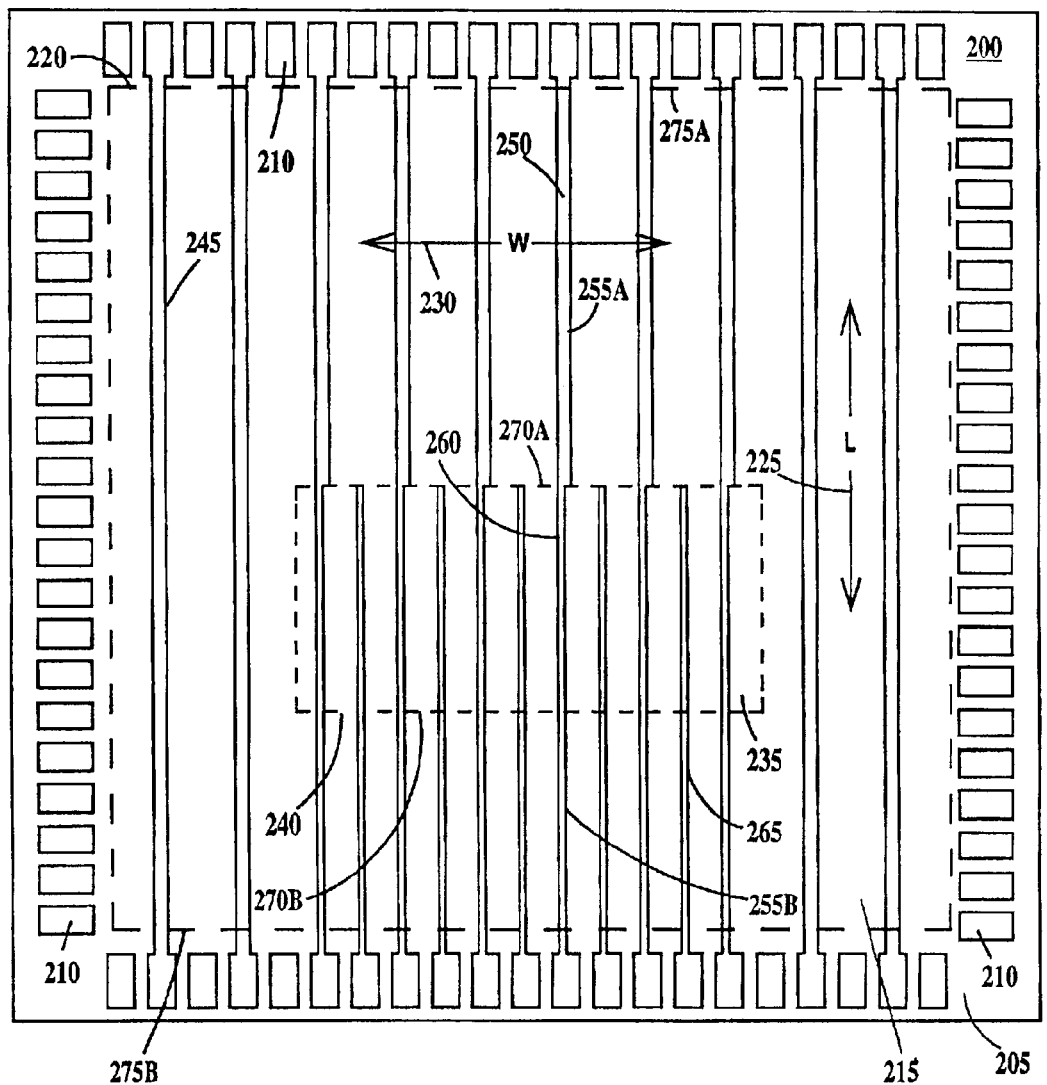
FIG. 4 is a plan view of the power buses of an integrated circuit having a voltage island according to a second embodiment of the present invention.

FIG. 4 is a plan view of the power buses of an integrated circuit having a voltage island according to a second embodiment of the present invention. In FIG. 4, an integrated circuit chip 200 includes an outer peripheral region 205 having a multiplicity of peripheral pads 210 and an inner device region 215 having a perimeter 220. In one example, pads 210 are wire-bond pads. In another example, pads 210 are tape automated bond (TAB) bumps. In still another example, pads 210 are solder bump pads for receiving solder balls. Integrated chip 200 extends in a length (L) direction 225 and a width (W) direction 230. Contained within device region 215 is a voltage island 235 having a perimeter 240.

A first set of global power buses 245 extend across chip 200 along length direction 225 between a first and a second subset of pads 210 which are located on opposite sides of the chip. A second set of global power buses 250 extends across chip 200 along length direction 225 and through voltage island 235 between a third and fourth subset of pads 210 which are located on opposite sides of the chip. Global power buses 250 have a wide portion 255A, a narrow portion 260 and a second narrow portion 255B. Wide portions 255A of global power buses 250 extend only between a first side 270A of voltage island 235 and a first side 275A of device region 215. Narrow portions 260 of global power buses 250 (within voltage island 235) extend only between side 270A of voltage island 235 and a second side 270B of the voltage island. Narrow portions 255B of global power buses 250 (without voltage island 235) extend only between second side 270B of voltage island 235 and a second side 275B of device region 215. Sides 270A and 270B of voltage island 235 are opposing sides of the voltage island. Sides 275A and 275B of device region 215 are opposing sides of the device region.

Voltage island 235 further includes voltage island power buses 265 extending from a fifth subset of pads 210. Voltage island power buses 265 and narrow portions 260 of global power buses 250 extend parallel to each other within voltage island 235.

In the second embodiment of the present invention, perimeter 240 of voltage island 235 does not overlay any portion of perimeter 220 of device region 215.

Figure 5:
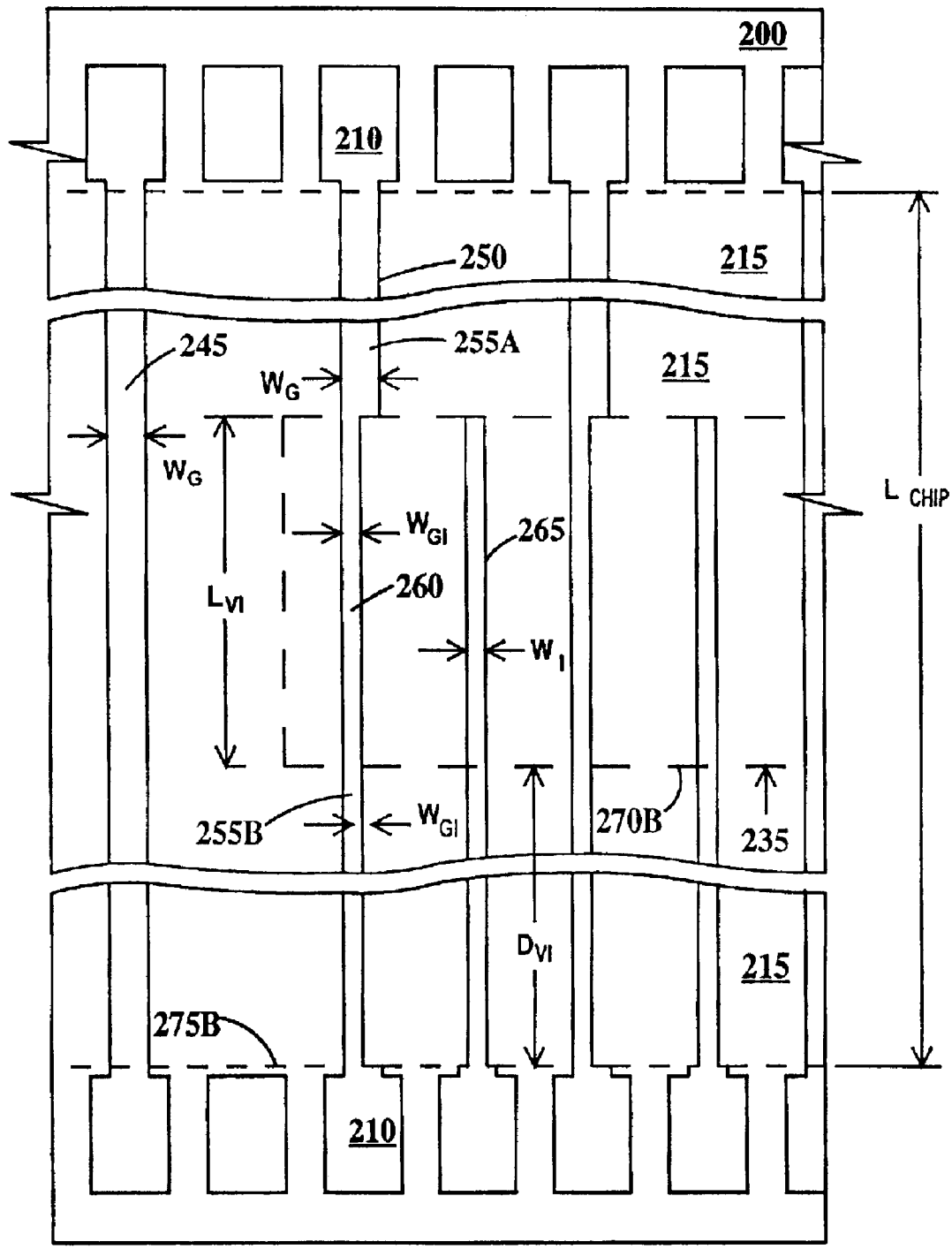
FIG. 5 is a plan view of a portion of the integrated circuit of FIG. 4 illustrating the widths of the various power buses.

FIG. 5 is a plan view of a portion of the integrated circuit of FIG. 4 illustrating the widths of the various power buses. In FIG. 5, each global power bus 245 has a width "$W_G$," each wide portion 255A of global power buses 250 has a width "$W_G$," each narrow portion 260 of global power buses 250 has a width "$W_{GI}$," each narrow portion 255B of global power buses 250 has a width "$W_{GI}$" and each voltage island power bus 265 has a width "$W_I$." "$W_I$"+"$W_{GI}$" is less than or equal to "$W_G$." "$W_{GI}$" and "$W_I$" may or may not be equal. Device region 215 of integrated circuit chip 200 has a length "$L_{CHIP}$" (effectively the length of the global power buses 245 and 250). Voltage island 235 has a length "$L_{VI}$." Second side 270B of voltage island 235 is located a distance "$D_{VI}$" from second side 275B of device region 215.

In a manner similar to that used for the first embodiment of the present invention, the following equation may be developed relating "$W_G$," "$W_{GI}$," "$W_I$," "$L_{CHIP}$," "$L_{VI}$" and "$D_{VI}$" under the condition of equal IR power drop for all power buses and the condition of equal power density in the voltage island and the non-voltage island portions of the device region.

$$\frac{W_{GI} + W_I}{W_G} = 1 + R1(2R2 - R1)\left(4 - \frac{1}{(1-R2)R2}\right) \qquad (9)$$

where: $W_G$=the width of the bus outside the voltage island; $W_{GI}$=the width of the bus inside the voltage island; $W_I$=the width of the voltage island bus; $R1=L_{VI}/L_{CHIP}$; $R2=(L_{VI}+D_{VI})/L_{CHIP}$; $L_{CHIP}$=the length of the device region in the bus direction; $L_{VI}$=the length of the voltage island in the bus direction; and $D_{VI}$=the distance of the voltage island to the side of the device region from which voltage island power buses extend.

While equation (9) is developed for the specific case where narrow portions 260 and narrow portions 255B of global power buses 250 have the same width, "$W_{GI}$," one skilled in the art may develop equations where the widths are not the same. Also, one skilled in the art may develop equations under the condition of the IR drops of power buses passing through the voltage island is different from the IR drop of buses not passing through the voltage island and under the condition where the current densities are not the same in the voltage island and the non-voltage island portion of the device region.

Figure 6:
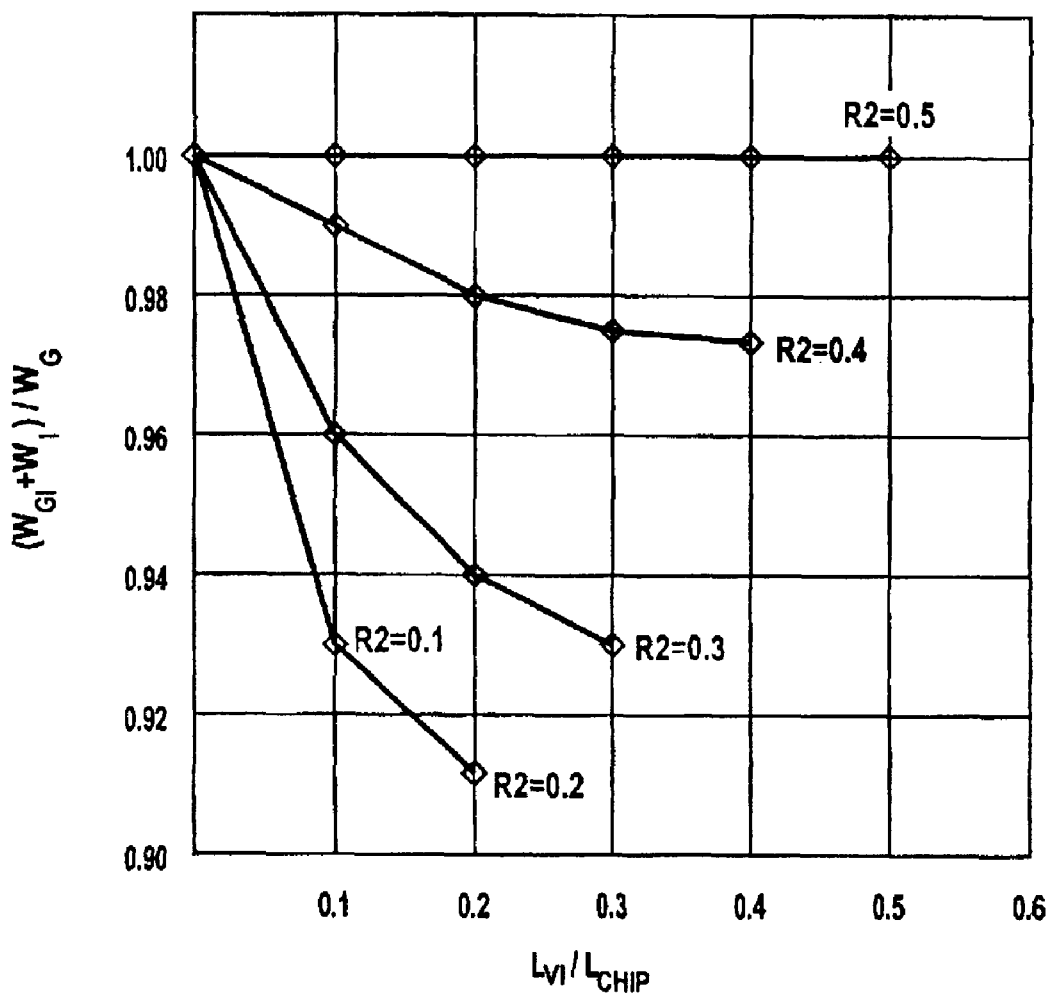
FIG. 6 is a plot of the relationship between the various power bus wiring widths and the lengths of the chip and voltage islands in the direction of the power buses for the second embodiment of the present invention.

FIG. 6 is a plot of the relationship between the various power bus wiring widths and the lengths of the chip and voltage islands in the direction of the power buses for the second embodiment of the present invention. Equation (9) is plotted for five values of R2 ($L_{VI}/L_{CHIP}$). All curves are terminated at $L_{VI}=L_{CHIP}/2$, so the minima of each case is the last point plotted. The curves for R2=0.1 and 0.2 overlap at $L_{VI}/L_{CHIP}$=0 and 0.1 to two decimal places. The curve for R2=0.1 has only two points, $L_{VI}/L_{CHIP}$=0 and $L_{VI}/L_{CHIP}$=0.1.

Figure 7:
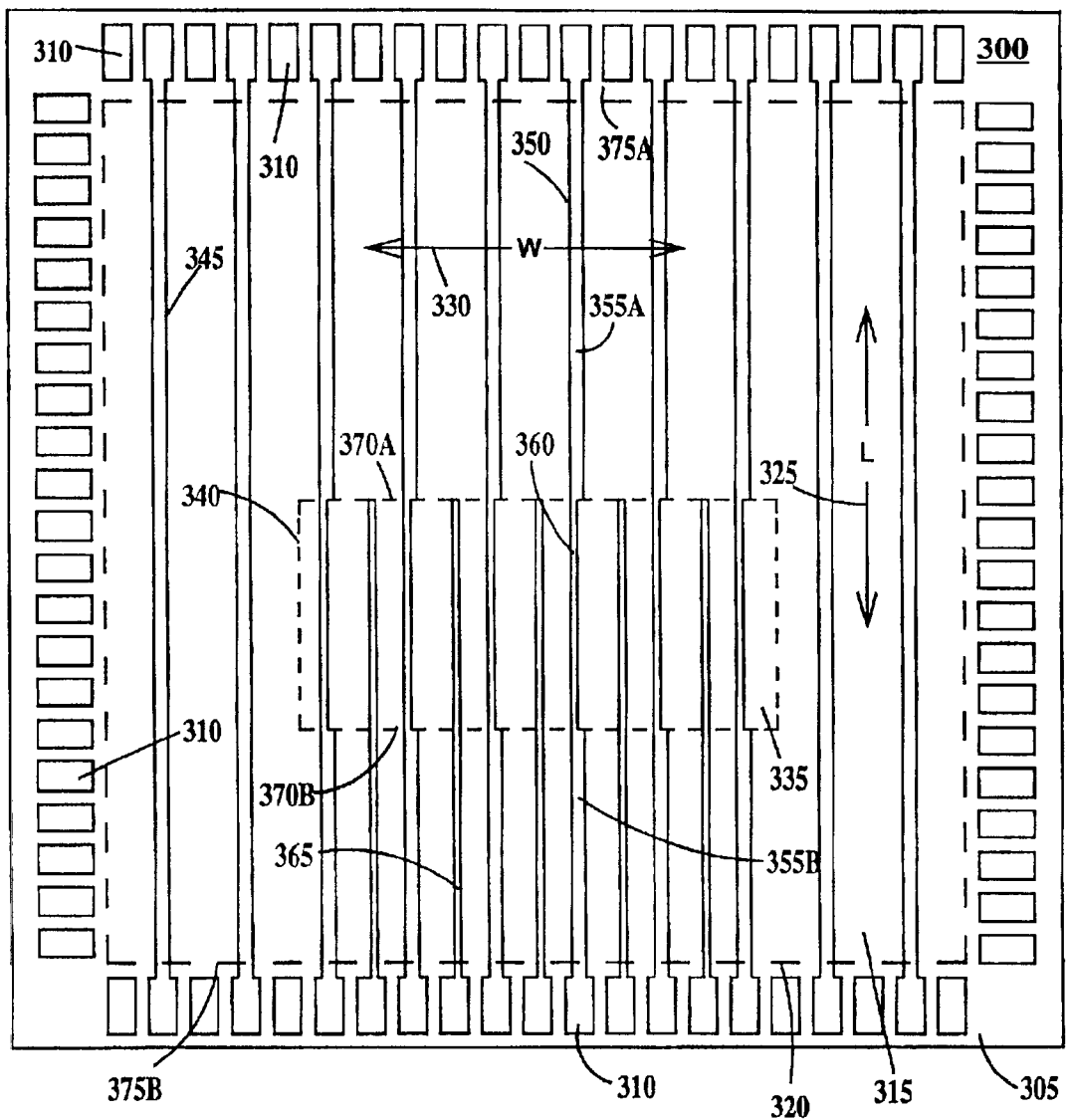
FIG. 7 is a plan view of the power bus of an integrated circuit having a voltage island according to a third embodiment of the present invention.

FIG. 7 is a plan view of the power buses of an integrated circuit having a voltage island according to a third embodiment of the present invention. In FIG. 7, an integrated circuit chip 300 includes an outer peripheral region 305 having a multiplicity of peripheral pads 310 and an inner device region 315 having a perimeter 320. In one example, pads 310 are wire-bond pads. In another example, pads 310 are tape automated bond (TAB) bumps. In still another example, pads 310 are solder bump pads for receiving solder balls. Integrated chip 300 extends in a length (L) direction 325 and a width (W) direction 330. Contained within device region 315 is a voltage island 335 having a perimeter 340.

A first set of global power buses 345 extend across chip 300 along length direction 325 between a first and a second subset of pads 310 which are located on opposite sides of the chip. Global power buses 350 have a first wide portion 355A, a narrow portion 360 and a second wide portion 355B. First wide portions 355A of global power buses 350 extend only between a first side 370A of voltage island 335 and a first side 375A of device region 315. Narrow portions 360 of global power buses 350 extend only between side 370A of voltage island 235 and a second side 370B of voltage island 335. Second wide portions 355B of global power buses 350 extend only between a second side 370B of voltage island 335 and a second side 375B of device region 315. Sides 370A and 370B of voltage island 335 are opposing sides of the voltage island. Sides 375A and 375B of device region 315 are opposing sides of the device region.

Voltage island 335 further includes voltage island power buses 365 extending from a fifth subset of pads 310. Voltage island power buses 365 and narrow portions 360 of global power buses 350 extend parallel to each other within voltage island 335.

In the third embodiment of the present invention, perimeter 340 of voltage island 335 does not overlay any portion of perimeter 320 of device region 315.

Figure 8:
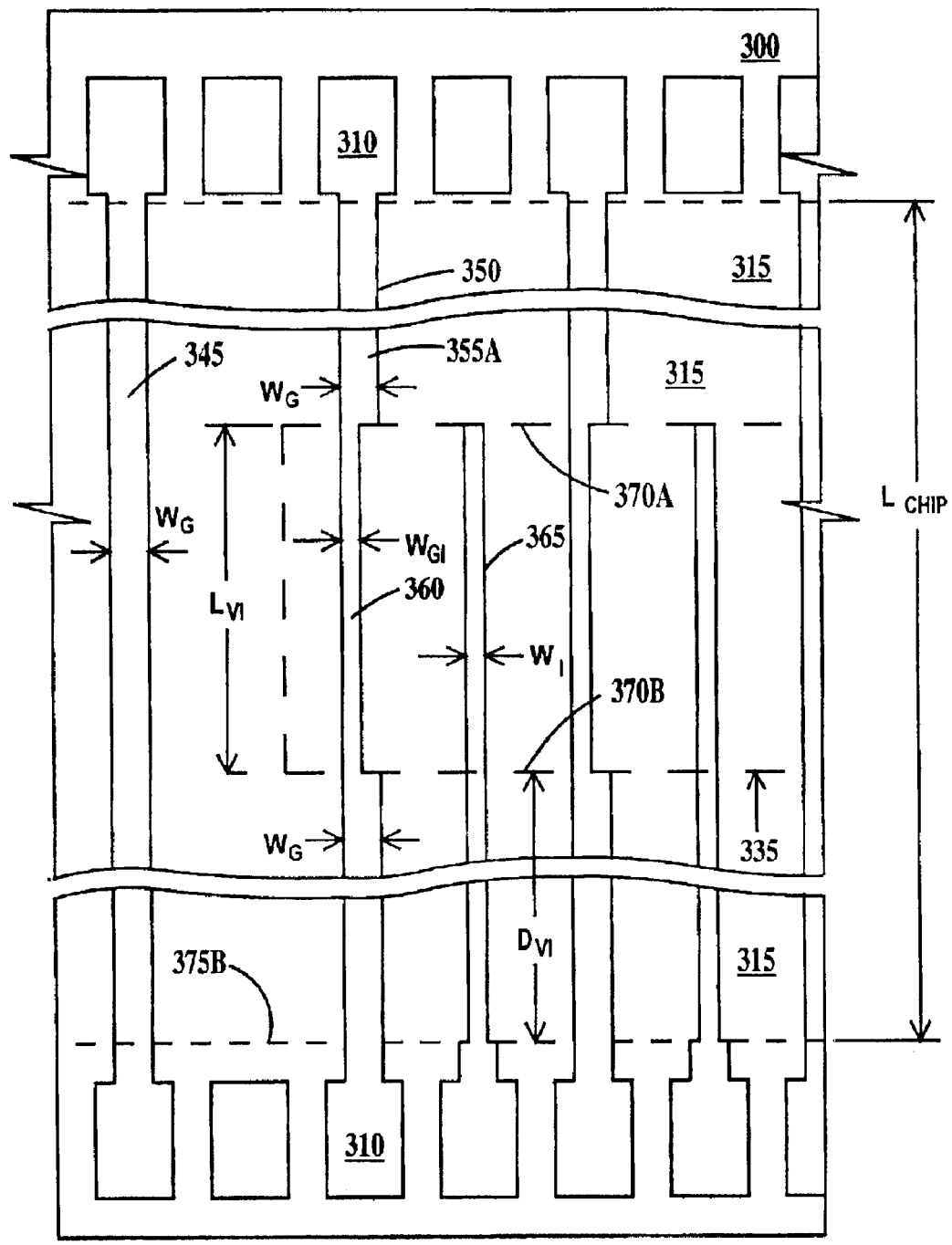
FIG. 8 is a plan view of a portion of the integrated circuit of FIG. 7 illustrating the widths of the various power buses.

FIG. 8 is a plan view of a portion of the integrated circuit of FIG. 7 illustrating the widths of the various power buses. In FIG. 8, each global power bus 345 has a width "$W_G$," each wide portion 355A of global power buses 350 has a width "$W_G$," each narrow portion 360 of global power buses 350 has a width "$W_{GI}$" and each voltage island power bus 365 has a width "$W_I$." "$W_I$"+"$W_{GI}$" is less than or equal to "$W_G$." "$W_{GI}$" and "$W_I$" may or may not be equal. Device region 315 of integrated circuit chip 300 has a length "$L_{CHIP}$" (effectively the length of the global power buses 345 and 350). Voltage island 335 has a length "$L_{VI}$."

One skilled in the art can develop an equation for the third embodiment of the present invention in a manner similar to equations (6) and (9).

Figure 9:
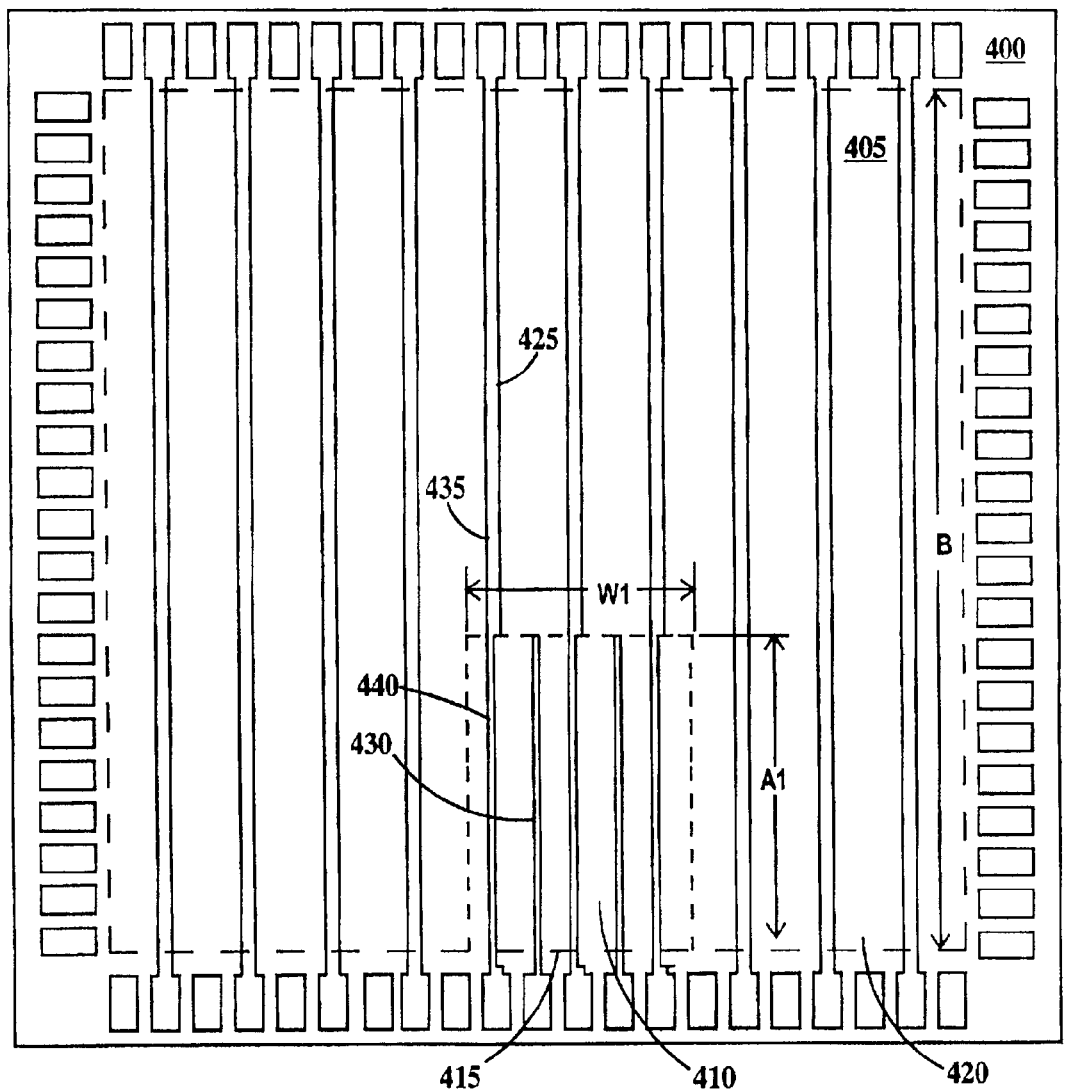
FIGS. 9 and 10 are plan views of the power grid of an integrated circuit having a voltage island wherein the layout of the voltage island is optimized by the method of the present invention.
Figure 10:
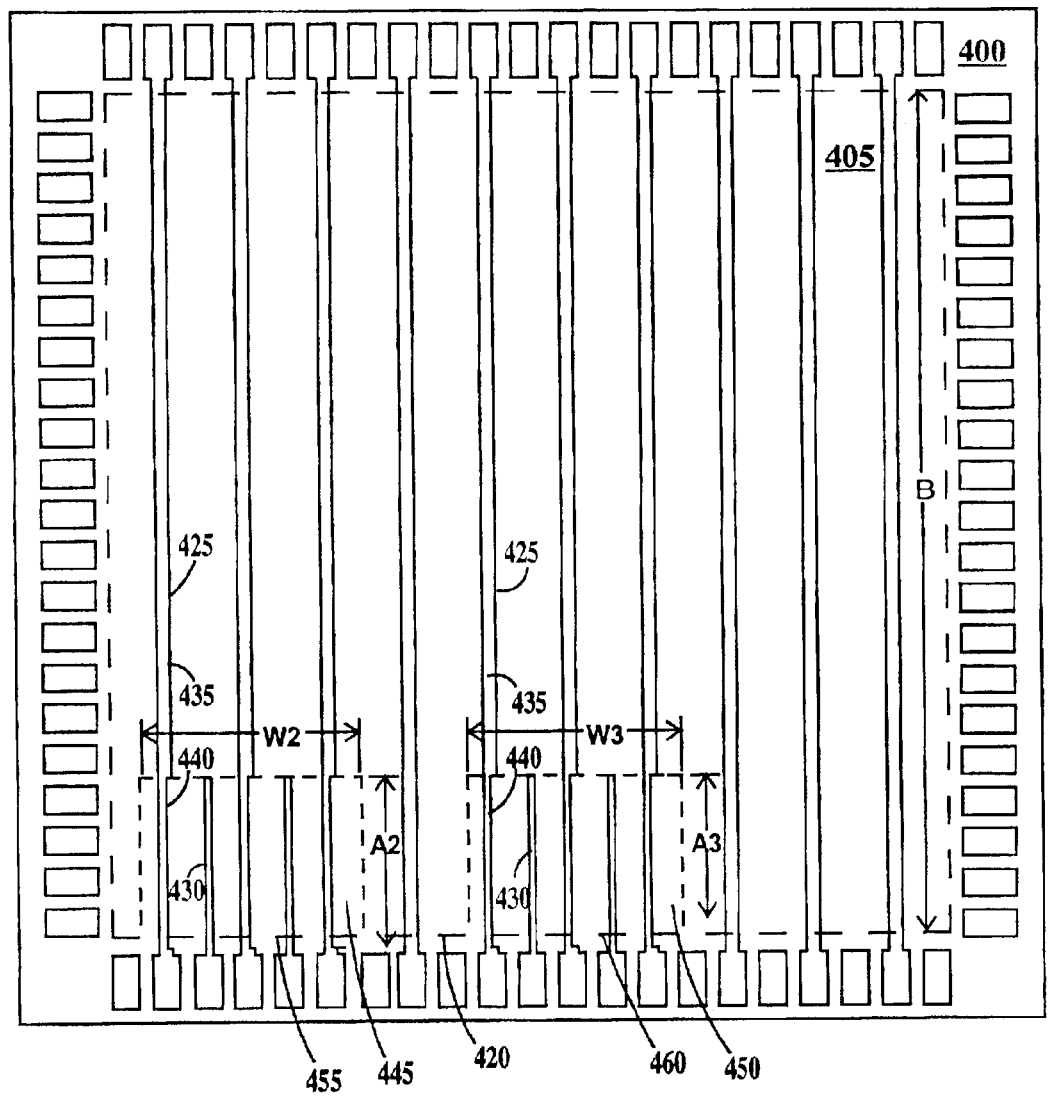

FIGS. 9 and 10 are plan views of the power grid of an integrated circuit having a voltage island wherein the layout of the voltage island is optimized by the method of the present invention. In FIG. 9, integrated circuit chip 400 includes having a inner device region 405 and a voltage island 410. Voltage island 410 has a side 415 co-incident with a portion of a side 420 of inner device region 405. Voltage island 415 has a length "A1" and a width "W1." Device region 420 has a length "B." Integrated circuit chip 400 also includes a set of global power buses 425 extending across chip 400 and through voltage island 410 and a set of voltage island power buses 430. Global power buses 425 have a wide portion 435 outside of voltage island 410 and a narrow portion 440 inside of the voltage island.

For the purposes of illustration assume that the ratio of A/B=0.4. Examining FIG. 3, (where A/B=$L_{VI}/L_{CHIP}$) it is found that using a "thinned" global power bus within voltage island 410 results in about a 3% savings in total power bus widths (($W_{GI}$+$W_I$)/$W_G$ equals 0.97 at $L_{VI}/L_{CHIP}$=0.4) This savings in total power bus width may be further increased as illustrated in FIG. 10 and described below.

Turning to FIG. 10, in FIG. 10, voltage island 415 of FIG. 9 is split into two portions, a first voltage island portion 445 and a second voltage island portion 450. First voltage island portion 445 has a side 455 co-incident with a portion of a side 420 of inner device region 405. Second voltage island portion 450 has a side 460 co-incident with a portion of a side 420 of inner device region 405. First voltage island portion 445 has a length "A2" and second voltage island portion 450 has a length "A3." First voltage island portion 445 has a width "W2" and second voltage island portion 450 has a width "W3" where "W1" (see FIG. 9)="W2"="W3" such that the combined area of first and second voltage island portions 445 and 450 equals the area of voltage island 410 of FIG. 9.

For the purposes of illustration further assume that the ratio of A2/B=A3/B=0.2. Examining FIG. 3, (where A2/B=A3/B=$L_{VI}/L_{CHIP}$) it is found that using a "thinned" global power bus within each first and second voltage island portions 445 and 450 results in about a 9% (($W_{GI}$+$W_I$)/$W_G$ equals 0.91 at $L_{VI}/L_{CHIP}$=0.2) savings in total power bus widths. Therefore, the present invention of using "thinned" global power buses within the voltage island yields the maximum total power bus width savings when the voltage island length to chip length ratio is selected to coincide with the minima of FIG. 3.

While in the present example, the lengths "A2"="A3"=(A1)/2 and the widths "W1"="W2"="W3" such that voltage island 410 (see FIG. 9) and voltage island portions. 445 and 450 have equal areas, many other combination of length and width are possible that yield significant total power bus width savings. Also, first and second voltage island portions may be non-contiguous as illustrated in FIG. 10 or they may be contiguous as long as sides 455 and 460 are co-incident (for the first embodiment) with a portion of side 420 of inner device region 405.

Figure 11A:
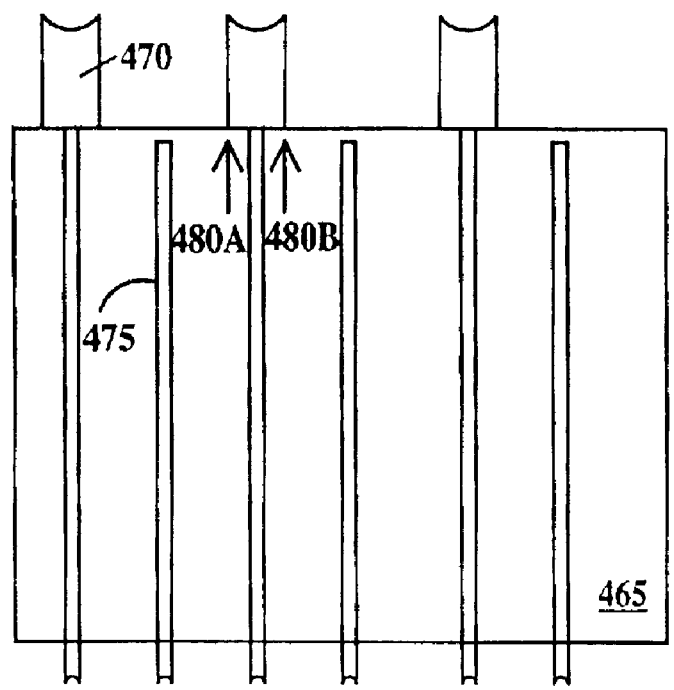
FIGS. 11A and 11B are plan views of alternative layouts of the power buses of a voltage island according to the present invention.
Figure 11B:
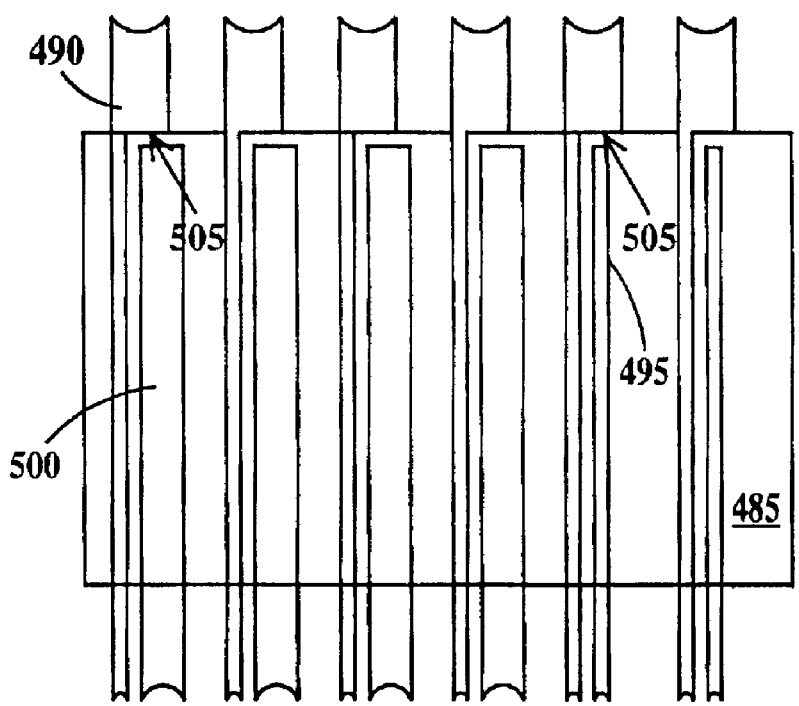

FIGS. 11A and 11B are plan views of alternative layouts of the power buses of a voltage island according to the present invention. In FIG. 11A, a voltage island 465 contains global power buses 470 having reduced widths within the voltage island and voltage island power buses 475. Global power buses 475 are reduced in width by forming notches 480A and 480B on either side of the global power buses. Notches 480A and 480B may or may not be equal in width.

In FIG. 11B, voltage island 485 contains global power buses 490 having reduced widths within the voltage island and first and second voltage island power buses 495 and 500. Global power buses 490 are reduced in width by forming notches 505 on one side of each global power bus. First voltage island power buses 495 are positioned to lie widthwise completely within notches 505. Second voltage island power buses 500 are positioned to lie widthwise partially within notches 505.

Thus, the present invention provides a method of providing increased voltage island wiring space that does not require increasing the size of the chip nor degrade device performance.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device comprising:
   a global power bus having a first portion for supplying power to a first set of circuits and a second portion for supplying power to a second set of circuits;
   a local power bus for supplying alternative power to said second set of circuits; and
   wherein the total of the width of said second portion of said global power bus and of the width of said local power bus does not exceed the width of said first portion of said global power bus.

2. The semiconductor device of claim 1, further including:
   a global ground bus having a first portion for supplying ground to said first set of circuits and a second portion for supplying ground to said second set of circuits.

3. The semiconductor device of claim 2, wherein said first portion of said ground bus is wider than said second portion of said ground bus.

4. The semiconductor device of claim 2, further including:
a local ground bus for supplying alternative ground to said second set of circuits; and
wherein the total of the width of said second portion of said global ground bus and of the width of said local ground bus does not exceed the width of said first portion of said global ground bus.

5. An integrated circuit chip comprising:
a first set of circuits contained within a device region of said integrated circuit chip;
a second set of circuits contained within a voltage island, said voltage island contained within said device region;
a global power bus having a first portion outside of said voltage island for supplying power to said first set of circuits and a second portion within said voltage island for supplying power to said second set of circuits;
a local power bus within said voltage island for supplying alternative power to said second set of circuits; and
wherein the total of the width of said second portion of said global power bus and of the width of said local power bus does not exceed the width of said first portion of said global power bus.

6. The integrated circuit chip of claim 5, further including:
a global ground bus having a first portion outside of said voltage island for supplying ground to said first set of circuits and a second portion within said voltage island for supplying ground to said second set of circuits; and
wherein said first portion of said ground bus is wider than said second portion of said ground bus.

7. The integrated circuit chip of claim 6, further including:
a local ground bus within said voltage island for supplying alternative ground to said second set of circuits; and
wherein the total of the width of said second portion of said global ground bus and of the width of said local ground bus does not exceed the width of said first portion of said global ground bus.

8. The integrated circuit chip of claim 5, wherein a side of said voltage island is co-incident with a side of said device region, said side of said voltage island disposed perpendicular to the length of said global power bus.

9. The integrated circuit chip of claim 5, wherein said first portion of said global power bus is disposed on a first side of said voltage island and, wherein said global power bus further includes a third portion disposed on a second side of said voltage island, said second side opposite from said first side.

10. The integrated circuit chip of claim 9, wherein the width of said third portion of said global power bus is equal to the width of said second portion of said global power bus.

11. The integrated circuit chip of claim 9, wherein the width of said third portion of said global power bus is equal to the width of said first portion of said global power bus.

12. A method of supplying power to an integrated circuit chip comprising:
providing a global power bus having a first portion for supplying power to a first set of circuits and a second portion for supplying power to a second set of circuits;
providing a local power bus for supplying alternative power to said second set of circuits; and
wherein the total of the width of said second portion of said global power bus and of the width of said local power bus does not exceed the width of said first portion of said global power bus.

13. The method of claim 12, further including:
providing a global ground bus having a first portion for supplying ground to said first set of circuits and a second portion for supplying ground to said second set of circuits; and
wherein said first portion of said ground bus is wider than said second portion of said ground bus.

14. The method of claim 12, further including:
providing a local ground bus for supplying alternative ground to said second set of circuits; and
wherein the total of the width of said second portion of said global ground bus and of the width of said local ground bus does not exceed the width of said first portion of said global ground bus.

15. The method of claim 12, further including:
providing within said integrated chip, a device region for containing said second set of circuits; and
providing within said device region, a voltage island for containing said second set of circuits.

16. The method of claim 15, further including disposing a side of said voltage island perpendicular to the length of said global power bus and co-incident with a side of said device region.

17. The method of claim 15, further including:
disposing said first portion of said global power bus on a first side of said voltage island; and,
disposing a third portion of said global power bus on a second side of said voltage island, said second side opposite from said first side.

18. The method of claim 16, further including selecting values for widths of said first and second portions of said global power bus and said local power bus, a length of said voltage island and a length of said device region under the conditions of equal allowed IR drop and power density in said device region and said voltage island based on the equation:

$$\frac{W_{GI} + W_I}{W_G} = \frac{L_{CHIP} - 2L_{VI}}{L_{CHIP} - L_{VI}} + \frac{4L_{VI}^2}{L_{CHIP}^2}$$

where:
$W_G$=the width of said first portion of said global power bus;
$W_{GI}$=the width of said second portion of said global power bus;
$W_I$=the width of said local power bus;
$L_{CHIP}$=the length of said device region; and
$L_{VI}$=the length of said voltage island.

19. The method of claim 17, further including selecting values for widths of said first and second portions of said global power bus and said local power bus, a length of said voltage island and a length of said device region under the conditions of equal allowed IR drop and power density in said device region and said voltage island based on the equation:

$$\frac{W_{GI} + W_I}{W_G} = 1 + R1(2R2 - R1)\left(4 - \frac{1}{(1 - R2)R2}\right)$$

where:
$W_G$=the width of the bus outside the voltage island;
$W_{GI}$=the width of the bus inside the voltage island;
$W_I$=the width of the voltage island bus;

$R1 = L_{VI}/L_{CHIP}$;

$R2 = (L_{VI} + D_{VI})/L_{CHIP}$;

$L_{CHIP}$ = the length of the device region in the bus direction;

$L_{VI}$ = the length of the voltage island in the bus direction; and $D_{VI}$ = the distance of the voltage island to the side of the device region from which voltage island power buses extend.

* * * * *